United States Patent
Gruber et al.

(10) Patent No.: US 10,877,919 B2
(45) Date of Patent: Dec. 29, 2020

(54) METHOD TO SYNCHRONIZE INTEGRATED CIRCUITS FULFILLING FUNCTIONAL SAFETY REQUIREMENTS

(71) Applicant: Integrated Device Technology, Inc., San Jose, CA (US)

(72) Inventors: Dominik Gruber, Munich (DE); Michael Renken, Stuttgart (DE)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 26 days.

(21) Appl. No.: 16/040,009

(22) Filed: Jul. 19, 2018

(65) Prior Publication Data
US 2019/0026245 A1    Jan. 24, 2019

Related U.S. Application Data

(60) Provisional application No. 62/535,761, filed on Jul. 21, 2017.

(51) Int. Cl.
| | |
|---|---|
| *G06F 1/00* | (2006.01) |
| *G06F 13/42* | (2006.01) |
| *G01R 29/027* | (2006.01) |
| *G05B 19/05* | (2006.01) |
| *G06F 1/12* | (2006.01) |
| *G06F 11/07* | (2006.01) |
| *H03K 5/135* | (2006.01) |
| *H03K 3/3562* | (2006.01) |

(52) U.S. Cl.
CPC ......... *G06F 13/42* (2013.01); *G01R 29/0273* (2013.01); *G05B 19/058* (2013.01); *G06F 1/12* (2013.01); *G06F 11/0751* (2013.01); *H03K 3/3562* (2013.01); *H03K 5/135* (2013.01)

(58) Field of Classification Search
CPC ...................................................... G06F 13/42
See application file for complete search history.

(56) References Cited

U.S. PATENT DOCUMENTS

| | | | |
|---|---|---|---|
| 7,752,365 B2 | 7/2010 | Taylor et al. | |
| 8,630,314 B2 | 1/2014 | York | |
| 2005/0201421 A1* | 9/2005 | Bhandari | H04J 3/0682 370/519 |
| 2006/0182214 A1* | 8/2006 | Hwang | G06F 1/10 375/359 |
| 2006/0245515 A1 | 11/2006 | Tachi | |
| 2015/0134764 A1* | 5/2015 | Noebauer | H04J 3/0667 709/208 |
| 2015/0169482 A1 | 6/2015 | Ngo et al. | |
| 2016/0359609 A1* | 12/2016 | Ito | H04L 43/0852 |
| 2018/0115409 A1* | 4/2018 | Nayyar | H04J 3/0685 |

OTHER PUBLICATIONS

International Search Report and Written Opinion issued in related PCT App. No. PCT/US2018/043142 dated Oct. 3, 2018 (13 pages).

* cited by examiner

*Primary Examiner* — Mohammed H Rehman
(74) *Attorney, Agent, or Firm* — Haynes and Boone, LLP

(57) ABSTRACT

In accordance with aspects of the present invention, a method of synchronizing two integrated circuits is presented. A method of synchronizing two integrated circuits can include sending a first pulse from a master IC to a slave IC over a SYNC bus; receiving a second pulse on the SYNC bus from the slave IC; checking the second pulse; triggering an interrupt if a failure is detected; and initiating measurement if synchronization is detected.

12 Claims, 3 Drawing Sheets

METHOD TO SYNCHRONIZE INTEGRATED CIRCUITS FULFILLING FUNCTIONAL SAFETY REQUIREMENTS

RELATED APPLICATIONS

The present application claims priority to U.S. Provisional Application 62/535,761, filed on Jul. 21, 2017, which is herein incorporated by reference in its entirety.

TECHNICAL FIELD

Embodiments of the present invention are related to synchronizing integrated circuits and, in particular, to synchronizing integrated circuits that are fulfilling functional safety requirements.

DISCUSSION OF RELATED ART

Integrated circuits are used throughout modern systems, including process controls, machinery operations (e.g., automotive, aviation, marine, constructions, or other mechanical devices), elevators, variable speed drives, toxic gas or radiation monitoring systems, and general safety monitoring circuits. To a growing extent, integrated circuits supply the logic and control functions, control circuits for sensors, and sensors involved in controlling complex systems. High levels of integration within the ICs can simplify system-level implementation of both digital and analog integrated circuits involved with these systems. Failures of the integrated circuits in these systems lead to high safety risks in the resulting system being controlled. For example, the complex control systems in self-driving automobiles should be highly reliable.

The key functional safety standard is IEC 61508, which has been adapted to suit automotive (ISO 26262), process control (IEC 61511), PLC (IEC 61131-6), machinery (IEC 62061), variable speed drives (IEC 61800-5-2), and other areas. These safety standards directed to process controls, machinery, elevators, variable speed drives, and other equipment can dictate similar standards on the ICs that are provided to control those systems.

Functional safety deals with the confidence that a system will carry out its safety related task when it is required to do so. The functional safety operation of a system formed by integrated circuits is defined by one or more operations that must be carried out to achieve or maintain a safe state of the system. This commonly means that, when the system detects an unsafe condition, it brings the system to a defined safe state. The functional safety requirements are different from electrical, mechanical, or other passive safety standards because it is directed to the operation of the chip.

In general, there are three requirements on the development of ICs involved in functional safety: (1) That there is a rigorous development process; (2) That the Integrated Circuits be inherently reliable; and (3) That the ICs be fault tolerant. The first two requirements have more to do with production of individual ICs. The third requirement having to do with functionality.

Another factor for ICs involved in functional safety is the interoperability between individual ICs involved in the overall systems. In order for the system to operate correctly, signaling between individual ICs must be accurate, especially if the system is operating at a high speed (i.e. high clock rate). Consequently, there is a need for development of processes that improve the interoperability of ICs involved in functional safety.

SUMMARY

In accordance with aspects of the present invention, a method of synchronizing two integrated circuits is presented. A method of synchronizing two integrated circuits can include sending a first pulse from a master IC to a slave IC over a SYNC bus; receiving a second pulse on the SYNC bus from the slave IC; checking the second pulse; triggering an interrupt if a failure is detected; and initiating measurement if synchronization is detected.

These and other embodiments are further discussed below with respect to the following figures.

DETAILED DESCRIPTION

In the following description, specific details are set forth describing some embodiments of the present invention. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure.

This description and the accompanying drawings that illustrate inventive aspects and embodiments should not be taken as limiting—the claims define the protected invention. Various changes may be made without departing from the spirit and scope of this description and the claims. In some instances, well-known structures and techniques have not been shown or described in detail in order not to obscure the invention.

Two integrated circuits (ICs) are often operating at a high clock frequency generated by an internal phase-locked-loop (PLL). Especially in safety situations, the two integrated circuits need to operate and cycle accurately in order to safely fulfill its requirements. Consequently, if the two ICs are not synchronized, there may be safety issues.

Figure 1:
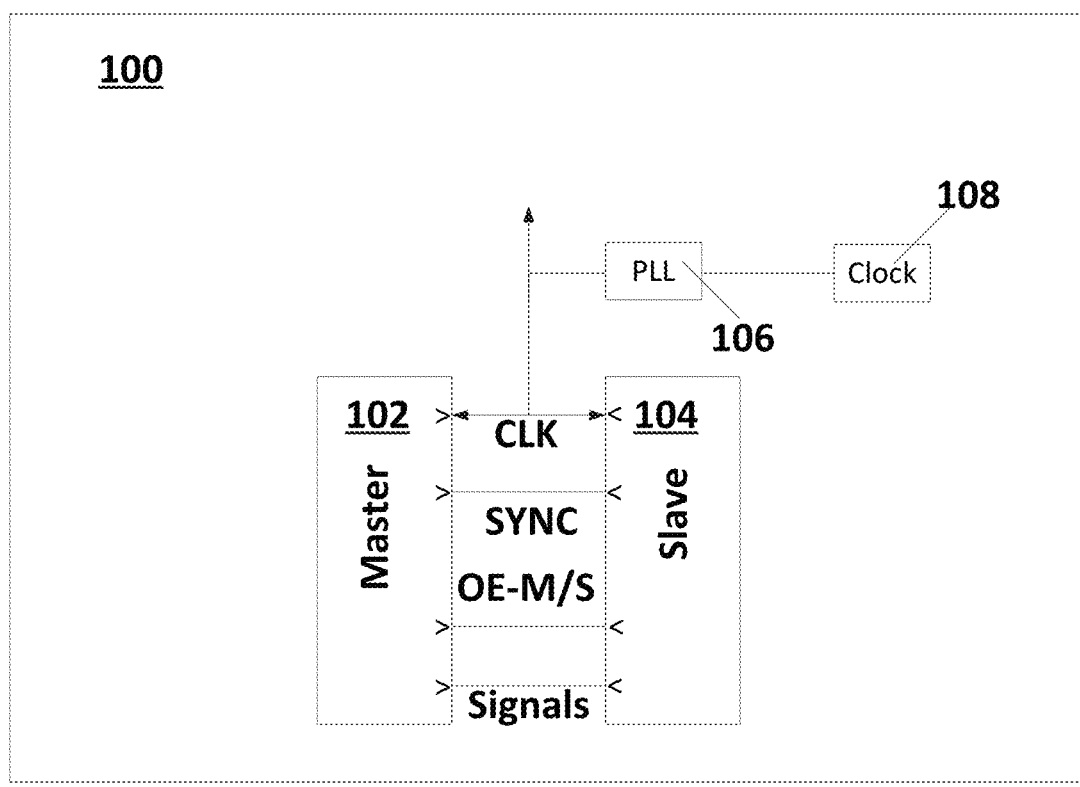
FIG. 1 illustrates a control circuit with a pair of ICs that are coupled to perform synchronization.

FIG. 1 illustrates a system 100 that includes two chips (master 102 and slave 104) that are involved in functional safety operations and which are to be synced to facilitate the safety functions of system 100. System 100 can be any system, for example a controller system, that fulfills a functional safety requirement. Although system 100 illustrates one master/slave pair, one skilled in the art would recognize that there may be multiple slaves 104 coupled to master 102 in order that system 100 may be synchronized.

As illustrated in FIG. 1, master 102 is coupled to slave 104 by a SYNC line. ICs 102 and 104 may also exchange enable signals OE_M and OE_S signals on an enable line. Further, each of ICs 102 and 104 receive a clock signal CLK that can be generated by a phase-locked-loop (PLL) 106 coupled to clock 108. Clock signals can also be generated internally to master 102 and slave 104. As is further illustrated, other signal lines are also coupled between master 102 and slave 104. Such lines may include instructions and data that are exchanged between master 102 and slave 104.

As is illustrated in FIG. 1, synchronization is accomplished using a bidirectional single wire interface, SYNC. A synchronous pulse is generated by master IC 102 and received by slave IC 104. After receiving and checking, slave IC 104 answers with a similar pulse. Master IC 102 checks the timing of the received answer from slave IC 104 (the Feedback signal) to judge if the synchronization was successful.

Figure 2:
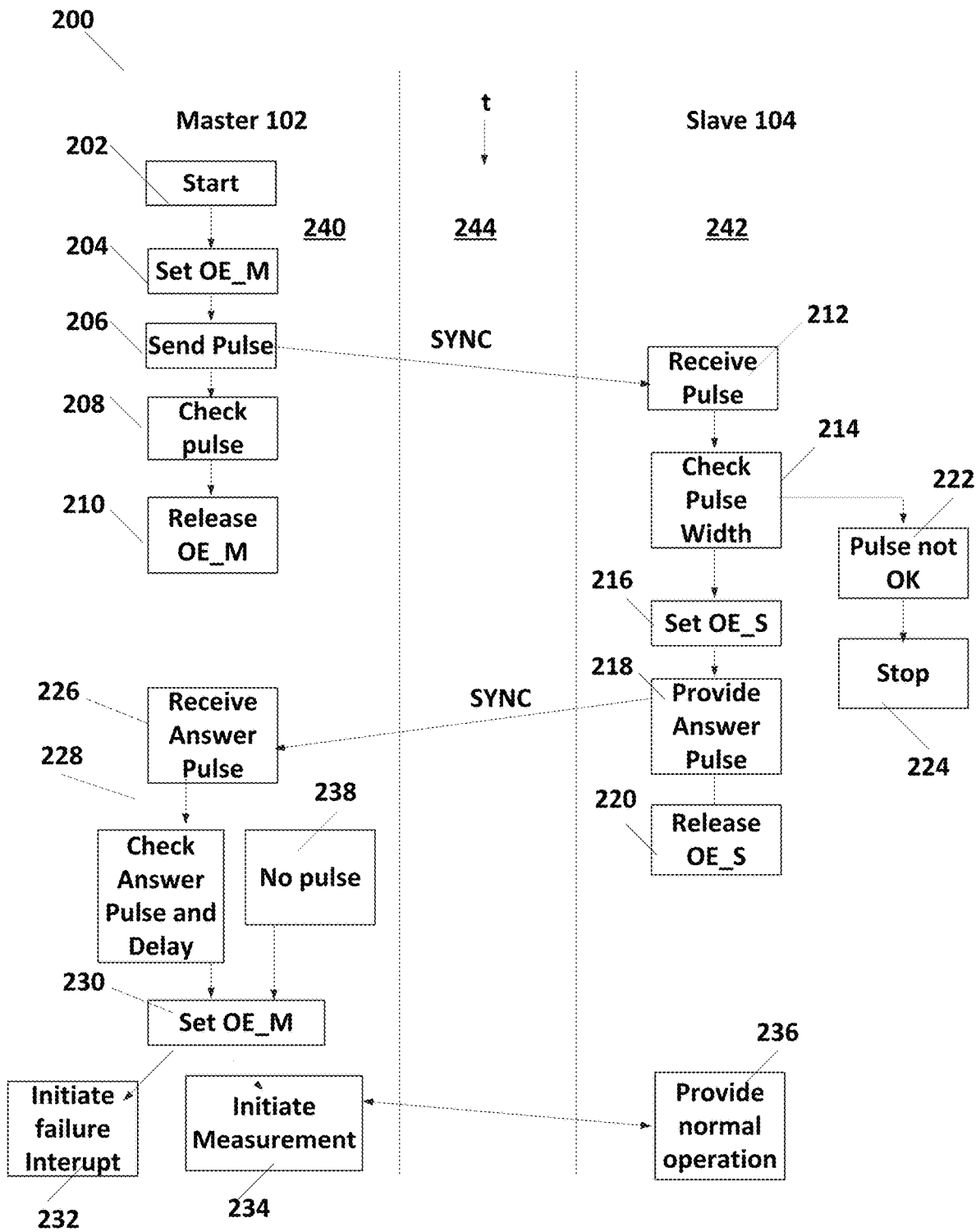
FIG. 2 further illustrates the synchronization process.
Figure 3:
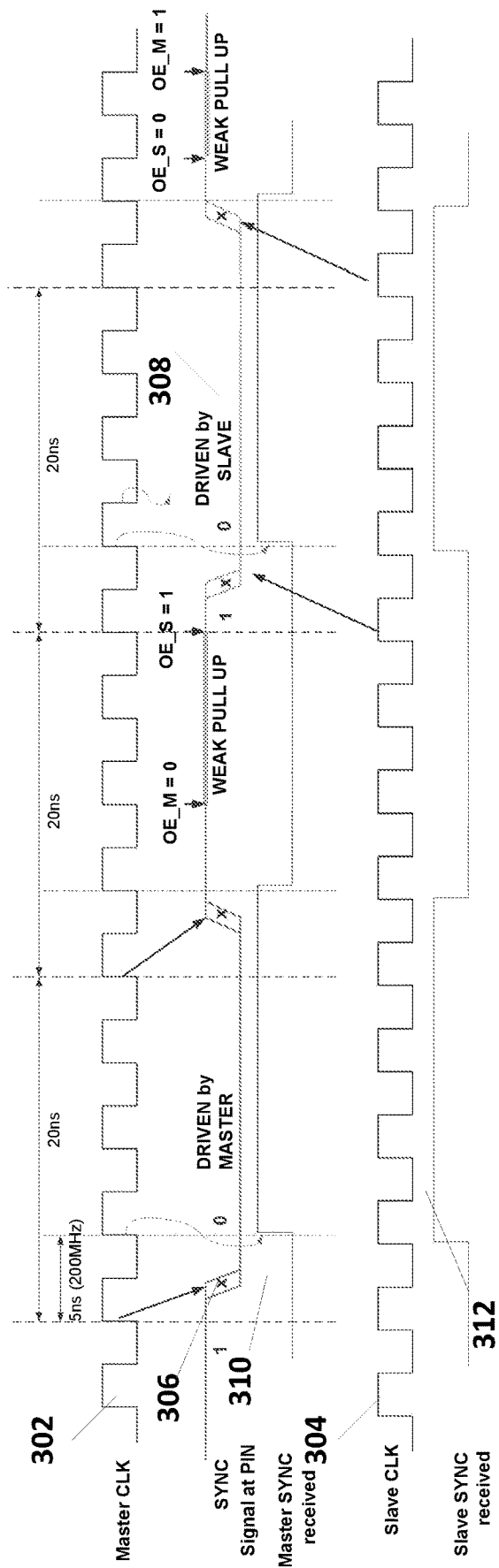
FIG. 3 illustrates the signals associated with the synchronization process illustrated in FIG. 2.

FIGS. 2 and 3 illustrate operation of master 102 and slave 104 according to some embodiments of the present invention. As illustrated in FIG. 3, master IC 102 receives clock 302 and slave IC 104 receives clock 304. Similarly, master IC 102 receives a SYNC signal 310 and slave IC 104 receives SYNC signal 312. As indicated, clock signal 302 and clock signal 304 are out of phase.

FIG. 2 illustrates a synchronization check algorithm 200 operated on master 102 and on slave 104. Master 102 executes algorithm 240 while slave 104 operates algorithm 242. Signals are sent between master 102 and slave 104 as illustrated in interface 244. Algorithm 200 starts in master 102 at start function 202. Start 202 may be initiated periodically throughout operation of system 100 in order to insure synchronization.

From start 202, master 102 exerts the OE_M signal to take control of the bus and, in step 206, sends the pulse 306 on the SYNC line. In step 208, master 102 checks the pulse width and the timing according to its clock signal 302 for accuracy. If the pulse is found to be good, then algorithm 240 proceeds to step 210 where master 102 releases the bus by resetting OE_M. As illustrated in FIG. 3, the signal on the SYNC line goes high because of a weak pull-up.

At slave 104, in step 212, the pulse on the SYNC line from master 102 is received. In step 214, slave 104 checks the pulse width using its clock signal 304. If the pulse width does not agree with what has been expected, then algorithm 242 proceeds to step 222 to indicate a faulty pulse width and algorithm 242 stops. If the pulse width does check out, the algorithm 242 proceeds to step 216 where slave 104 exerts an output enable signal OE_S to take over the bus. In step 218, slave 104 provides an answering pulse 308 and then proceeds to step 220 to release OE_S.

In algorithm 240 of master 102, answering pulse 308 is received in step 226. In step 228, master 102 checks answering pulse 308 with respect to width and delay in comparison with pulse 306. If the pulse is correct, the algorithm 240 proceeds to step 230 to set OE_M and then to step 234 to initiate measurement or normal activity. In algorithm 242, if step 234 is initiated in master 102, then slave 104 proceeds to step 236 to provide normal operation.

If the pulse is not correct, then algorithm 240 proceeds to step 230 to set OE_M and then to step 232 to initiate a failure interrupt so that system 100 can recover and proceed to a safe state. In the event that no pulse is received by master 102, algorithm 240 initiates step 238. From step 238, algorithm 240 proceeds to step 230 to set OE_M and then to step 232 to initiate a failure interrupt so that system 100 can recover and proceed to a safe state.

In summary, as indicated in FIGS. 2 and 3, the synchronization timing includes 1) Master 102 sending a pulse to slave 104; 2) Master 102 checking the pulse width and timing on the SYNC bus; 3) Master 102 releasing the SYNC bus to a weak pull-up (OE_M); 4) Slave 104 checking the pulse width; 5) Slave 104 enabling OE (OE_S); 6) Slave 104 answering with a pulse if the received pulse is correct; 7) Slave 104 releasing the SYNC bus (by disabling OE_S); 8) Master 102 checking the pulse width and delay from its pulse of the received pulse from slave 104; 9) Master 102 enabling OE (OE_M); and 10) Master 102 initiating measurement to proceed with normal operation OR triggering interrupts to indicate failure.

Although system 100, and PLL 106, can operate at any clock speed. As an example, FIG. 3 illustrates a 200 MHz clock. Consequently, clock signal 302 and clock signal 304 has a 5 ns period. In that case, pulse 306 sent by master 102 may send a 20 ns pulse (four clock periods) and slave 104 respond with a similar 20 ns pulse. Other pulse widths may be used in accordance with the clock signals. Further, in some embodiments, slave 104 may respond with a pulse 308 with a width different from that pulse 306 produced from master 102.

Several failures in the synchronization can be detected. These failures can include whether there is too low drive strength of master 102, which can be detected by direct feedback in master 102 at step 208, for example. Another failure can be if there is too low a drive strength in slave 104, which is detected by direct feedback in slave 104. Further, in step 228 master 102 can detect if there is too late detection of SYNC pulse by slave, which can be detected by checking response time in master 102. In some cases, master 102 can also detect if there is too early detection of SYNC pulse, which cannot happen by protocol but may happen by external disturbances. The pulse width received at slave 104 and at master 102 can provide information regarding external disturbances.

The above detailed description is provided to illustrate specific embodiments of the present invention and is not intended to be limiting. Numerous variations and modifications within the scope of the present invention are possible. The present invention is set forth in the following claims.

What is claimed is:

1. A method of synchronizing a master IC with a slave IC, comprising:
   in the master IC:
       sending a first pulse from the master IC to the slave IC over a SYNC bus;
       receiving a second pulse into the master IC on the SYNC bus that the slave IC sent in response to the first pulse;
       checking the second pulse to determine whether or not a pulse width of the second pulse or a delay between transmission of the first pulse and receipt of the second pulse is within expectations;
       triggering an interrupt if it is determined that the pulse width or delay of the second pulse is not within expectations;
       initiating measurement if synchronization is detected, and
   in the slave IC:
       receiving the first pulse on the SYNC bus;
       checking the first pulse to determine whether or not a pulse width of the first pulse is within expectations;
       if the pulse width of the first pulse is within expectations, the providing the second pulse on the SYNC bus; and
       if the pulse width of the first pulse is not within expectations, then stopping.

2. The method of claim 1, wherein sending the first pulse includes
   setting a master output enable signal;
   sending the first pulse;
   checking the first pulse; and
   releasing the master output enable signal.

3. The method of claim 1, wherein checking the second pulse to determine whether or not a pulse width is within expectations includes determining the pulse width with a clock signal.

4. The method of claim 1, wherein checking the second pulse to determine whether or not the delay is within expectations includes checking the delay with a clock signal.

5. The method of claim 1, wherein initiating measurement includes setting the master output enable signal prior to initiating measurement to provide normal operation.

6. A system performing functional safety requirements, comprising:
   a master IC, the master IC being coupled to a clock bus to receive a master clock input, a sync bus, and an output enable;
   a slave IC coupled to the master IC, the slave IC being coupled to the clock bus to receive a slave clock input, the sync bus, and the output enable, wherein the slave clock input and the master clock input are coupled to a clocking source, and
   wherein the master IC checks synchronization with the slave IC by
      sending a first pulse from the master IC to the slave IC over a SYNC bus;
      receiving a second pulse on the SYNC bus from the slave IC, the second pulse being sent from the slave IC in response to receipt of the first pulse on the SYNC bus;
      checking the second pulse to determine whether or not a pulse width of the second pulse or a delay between transmission of the first pulse and receipt of the second pulse is within expectations;
      triggering an interrupt if it is determined that the pulse width or delay of the second pulse is not within expectations;
      initiating measurement if synchronization is detected; and
   wherein the slave IC executes instructions to
      receive the first pulse on the SYNC bus;
      check the first pulse to determine whether or not a pulse width of the first pulse is within expectations;
      if the pulse width of the first pulse is within expectations, then provide the second pulse on the SYNC bus; and
      if the pulse width of the first pulse is not within expectations, then stop.

7. The system of claim 6, wherein sending the first pulse includes setting a master output enable signal on the output enable;
   sending the first pulse on the SYNC bus;
   checking the first pulse to determine whether a pulse width of the first pulse and a timing of the first pulse according to a master clock on the master clock input; and
   releasing the master output enable signal if the first pulse is found to be good.

8. The system of claim 6, wherein checking the second pulse to determine whether or not a pulse width is within expectation includes determining the pulse width with a slave clock signal on the slave clock input.

9. The system of claim 6, wherein checking the second pulse to determine whether or not the delay is within expectations includes checking the delay with a slave clock signal on the slave clock input.

10. The system of claim 6, wherein initiating measurement includes setting the master output enable signal prior to initiating measurement to provide normal operation.

11. The system of claim 6, wherein pulse widths are measured with a clock signal.

12. The system of claim 6, wherein the slave IC checks the first pulse by measuring the pulse width with a slave clock signal on the slave clock input.

* * * * *